United States Patent [19]
Oh

[11] Patent Number: 5,805,616
[45] Date of Patent: Sep. 8, 1998

[54] CIRCUIT OF CALCULATING ERRATA LOCATOR AND EVALUATOR POLYNOMIAL, CALCULATING METHOD THEREOF AND REED-SOLOMON DECODER USING THE SAME

[75] Inventor: Young-uk Oh, Incheon, Rep. of Korea

[73] Assignee: Samsung Electronics, Co., Ltd., Kyungki-do, Rep. of Korea

[21] Appl. No.: 552,551

[22] Filed: Mar. 20, 1996

[30] Foreign Application Priority Data

Nov. 10, 1994 [KR] Rep. of Korea ............... 94-294418

[51] Int. Cl.[6] .................................................. H03M 13/00
[52] U.S. Cl. ........................................................ 371/37.11
[58] Field of Search ................................ 371/37.1, 37.11

[56] References Cited

U.S. PATENT DOCUMENTS

| | | | |
|---|---|---|---|
| 5,446,743 | 8/1995 | Zook | 371/37.1 |
| 5,537,426 | 7/1996 | Lee | 371/37.1 |
| 5,583,499 | 12/1996 | Oh et al. | 341/94 |

*Primary Examiner*—Stephen M. Baker
*Attorney, Agent, or Firm*—Cushman Darby & Cushman IP Group of Pillsbury Madison & Sutro LLP

[57] ABSTRACT

The present invention relates to a circuit for calculating an ELP and an EEP, and a Reed-Solomon decoder using the same. The circuit includes: first storage device for storing a syndrome value, coefficient values of the ELP, a discrepancy value and the size of a shortened code; second storage device for storing the coefficient values of the ELP, the reciprocal value of the discrepancy, the discrepancy value, the coefficient values of the ELP and the values obtained by differentiating the coefficient values of the ELP; first selecting device for selectively outputting the values stored in the first storage device in response to first to sixth control signals; second selecting device for selectively outputting the values stored in the second storage device in response to the control signals; multiplication device for multiplying the values selected by the first and second selecting means; third selecting means for selectively outputting the resultant values multiplied by the multiplication device in response to the control signals; third storage device for storing the resultant values selectively output by said third selecting device. Accordingly, the construction of the circuit becomes simple and a chip area can be reduced at the time of integration.

5 Claims, 8 Drawing Sheets

CIRCUIT OF CALCULATING ERRATA LOCATOR AND EVALUATOR POLYNOMIAL, CALCULATING METHOD THEREOF AND REED-SOLOMON DECODER USING THE SAME

BACKGROUND OF THE INVENTION

The present invention relates to a Reed-Solomon decoder, and more particularly, to a Reed-Solomon decoder capable of reducing chip area by simplifying the circuit construction used for calculating an errata locator and evaluator polynomial.

One unavoidable problem in the communication field relates to errata generation due to channel noise. The Reed-Solomon decoder using a RS code is most superior in correcting burst errata.

The decoding order of the Reed-Solomon decoder is as follows.

Firstly, a syndrome is calculated from a receiving stream.

Secondly, an errata locator polynomial (ELP) is calculated from the syndrome.

Thirdly, an errata evaluator polynomial (EEP) is calculated from the syndrome and the ELP.

Fourthly, an errata location is determined from the ELP.

Fifthly, an errata value is calculated from the ELP and the EEP.

Sixthly, an errata pattern is calculated from the errata location and the errata value.

The ELP and the EEP are most important in controlling the performance and complexity of the decoder and can be obtained by using the Berlekamp-Massey Algorithm (BMA) and the Euclidean Algorithm (EA), respectively.

The parameter of the RS code is expressed as the following equation (1).

Code length: $n=q-1$, $q=2^m$

Message length: $k=n-2t$

Errata correcting capability: $t=(n-k)/2$

Minimum distance: $d_{min}=2t+1$ (1)

where, m gives the scope of a Galois field. If m=8, the scope of the Galois field is $2^8$ (=256). Here, q gives the value of another parameter determined by m.

If $\alpha$ is a primitive element in the finite field, i.e., the Galois field GF ($2^m$), the generator polynomial of a t-tuple errata correction (n, k, t) RS code is expressed as the following equation (2).

$$g(x) = (x+\alpha)(x+\alpha^2)\ldots(x+\alpha^{2t}) = \sum_{i=0}^{2t} g_i x^i \quad (2)$$

where, coefficient $g_i$ ($0 \leq i \leq 2t$) is an element of GF (2m) The code word of the RS code generated by the generator polynomial as in equation (2) can be obtained by expressing a remainder resulting from the division of an information polynomial (d(x)) by the generator polynomial as a parity check polynomial. The process is expressed by the following equation (3).

$$x^{n-k}d(x) = q(x)g(x) + \gamma(x) \quad (3)$$

FIG. 1 is general block diagram of a conventional Reed-Solomon decoder.

In Fig.1, the Reed-Solomon decoder includes syndrome calculating circuit 10, ELP calculating circuit 12, EEP calculating circuit 14, Chien's searching circuit 16, errata calculating circuit 18, gate 20, buffer register 22 and errata correction circuit 24.

If the output of an encoder, the noise on the channel and a receiving vector are put to c(x), n(x) and r(x), respectively, the interrelation of these terms can be expressed as the following equation (4).

$$c(x) = c_0 + c_1 x + c_2 x^2 + c_3 x^3 + \ldots + c_{n-2} x^{n-2} + c_{n-1} x^{n-1}$$
$$r(X) = r_0 + r_1 x + r_2 x^2 + r_3 x^3 + \ldots + r_{n-2} x^{n-2} + r_{n-1} x^{n-1} \quad (4)$$

$$e(x) = c(x) + r(x)$$
$$= T_{i1} x^{i1} + T_{i2} x^{i2} + \ldots + T_{iu} x^{iu} +$$
$$F_{j1} x^{j1} + F_{j2} x^{j2} + \ldots + F_{jp} x^{jp}$$

where, e(x) is an errata polynomial generated on the channel, $T_i X^i$ is an error of which the size and location are not known and $F_j X^j$ is an error of which only the size is not known, i.e., an erasure.

The first step of decoding is to calculate a syndrome polynomial (s(x)) from the receiving stream (r(x)) and it is possible to know whether the errata are included in the receiving stream from the syndrome value. Namely, if the syndrome value is 0, the errata are not included in the receiving stream and if not, the errata are included in the receiving stream. In decoding a t-tuple errata correction Reed-Solomon code, the syndrome can be obtained if $\alpha^i$ ($1 \leq i \leq 2t$), i.e., elements of finite field GF ($2^m$), are substituted in the receiving stream (r(x)). This process is expressed by the following equation (5).

$$s_i = r(a^i) \quad (1 \leq i \leq 2t) \quad (5)$$

In order to correct the errata detected by the syndrome, it is most important to know the locations and the sizes of the errata. In order to know the locations and the sizes of the errata, the ELP and the EEP are needed. When $\rho$ erasures and $\nu$ errors ($1 \leq \rho/2 + \nu \leq t$) are generated, an erasure locator polynomial, an error locator polynomial and the errata locator polynomial are expressed by the following equation (6).

$$\sigma_F(x) = \prod_{n=1}^{\rho} (1 - \alpha^{j_n} x) = 1 + \sigma_{F_1} x + \sigma_{F_2} x^2 + \ldots + \sigma_{F_\rho} x^\rho \quad (6)$$

$$\sigma_T(x) = \prod_{n=1}^{\mu} (1 - \alpha^{j_n} x) = 1 + \sigma_{T_1} x + \sigma_{T_2} x^2 + \ldots + \sigma_{T_\mu} x^\mu$$

$$\sigma(x) = \sigma_F(x) x \sigma_T(x)$$

In the above equation, $\sigma_F(x)$ denotes the erasure locator polynomial, $\sigma_T(x)$ denotes the error locator polynomial and $\sigma(x)$ denotes the errata locator polynomial.

FIG. 2 is a flow chart of the BMA used in order to obtain the errata locator polynomial.

The BMA continually executes process for obtaining a minimum solution of the ELP $\sigma(x)$. In each repeated step, the BMA should have the minimum solution with a coefficient satisfying a Newton's identical equation and a correction term related to a discrepancy.

The algorithm shown in FIG. 2 is explained as follows.

When n=o, it is initialized that $b_o=1$, $\sigma_o=1$, $s_o=0$, $n_o=0$, $l_o^{(1)}=0$ and $l_o^{(2)}=0$ (step 30).

n is increased by 1 (step 32).

It is judged whether n is not less than $\rho$ ($\rho$ is the number of erasure) (step 34).

If n is not greater than $\rho$, $(\sigma_{(x)})^{(n+1)}=(\sigma_{(x)})^{(n)}-\mu_\rho x(\sigma_{(x)})^{(n)}$, $(b_{(x)})^{(n+1)}=(\sigma_{(x)})^{(n+1)}$, $(l_{(n-1)})^{(1)}=(l_n)^{(1)}+1$, and $(l_{(n+1)})^{(2)}=l_n^{(2)}+1$ (step 36).

If n is not less than $\rho$, it is judged whether n is 2t, where t is an errata correction capability (step 38).

If n is 2t, $\sigma(x)$ becomes the ELP (step 40).

If n is not 2t, s is shifted to a right direction and a calculation according to the following equation is carried out (step 42).

$$d_n = s_n + \sum_{i=1}^{l_n^{(1)}} \sigma_i s_{n-i}$$

It is judged whether the discrepancy ($d_n$) is 0 (step 44). If the discrepancy ($d_n$) is 0, the equations, $(b_{(x)})^{(n+1)}=x(b_{(x)})^{(n)}$ and $(l_{(n+1)})^{(2)}=(l_n)^{(2)}+1$, are calculated (step 52).

If not, it is judged whether $l_n^{(1)} > l_n^{(2)}$ (step 46) If the condition of the step 46 is not satisfied, $(\sigma_{(x)})^{(n+1)}$, $(b_{(x)})^{(n+1)}$, $(l_{(n+1)})^{(1)}$ and $(l_{(n+1)})^{(2)}$ are calculated (step 48).

If satisfied, a calculation according to the following equation is performed (step 50) and then step 52 proceeds.

$$\sigma_{(x)}^{(n+1)}=\sigma_{(x)}^{(n)}-d_n x b_{(x)}^{(n)}$$
$$l_{(n+1)}^{(1)}=\max[l_{(n)}^{(1)}, l_{(n)}^{(2)}+1]$$

After the step 52 is executed, step 32 proceeds.

These operations are carried out to obtain the ELP.

The EEP can be calculated by using the value of the syndrome and the coefficient of the ELP and a calculating method thereof is expressed by the following equation (7).

$$Z(x)=1+(s_1+\sigma_1)\,x+(s_2+\sigma_1 s_1 +\sigma_2)\,x^2+\ldots+(s_{\rho+\mu}+\sigma_1 s_{\rho+\mu-1}+\sigma_2 s_{\rho+\mu-2}+\ldots+\sigma_{\rho+\mu})\,x^{\sigma+\mu} \quad (7)$$

The ELP calculated by the above method is used for calculating the errate size.

In Reed-Solomon codes, the roots of the ELP are calculated in order to figure out the locations of the errata generated in the receiving stream, because the reciprocal values of the roots of the ELP show the locations where the errata are generated.

The Chien's detecting method is widely used as the method of calculating the roots of the ELP. The Chien's detecting method is used to figure out the locations of the errata generated in the receiving stream $r(x)$ from the value of $\sigma(\alpha^i)$ obtained by substituting $\alpha^i$ ($1 \leq i \leq n$), i.e., the element of $GF(2^m)$, in the ELP $\sigma(X)$. Namely, if the value of $\sigma(\alpha^i)$ is 0, the errata are included in the receiving stream $r_{n-1}$ and if not, the errata are not included.

In the Reed-Solomon codes, since the symbol value of the receiving stream is non-dual value of $GF(2^m)$, the errata values of the locations where the errata are generated should be calculated. The errata values are calculated in the following equation (8) from the coefficients of the EEL and the roots of the ELP.

$$e_{j_m} = \frac{Z(\alpha^{-jm})}{\sigma'(\alpha^{-jm})} \quad (8)$$

The last step of the decoding is to correct the errata generated in the receiving stream. The correction of the errata is executed by a modulo-2 addition of an errata pattern $e(x)$ and the receiving stream $r(x)$ standing by until the errata calculation is finished, which can be expressed by as the following equation (9).

$$c(x)=r(x)+e(x) \quad (9)$$

Accordingly, since the conventional Reed-Solomon decoder constructed according to the algorithm as above uses a multiplier for each block for obtaining the ELP, the EEP, the errata values and the errata locations, the circuit construction is complicated and occupies considerable chip area.

SUMMARY OF THE INVENTION

It is an object of the present invention to provide a circuit for calculating an ELP and EEP, having both a simple construction and calculating method.

It is another object of the present invention to provide a Reed-Solomon decoder using the circuit for calculating the ELP and EEP.

To accomplish the above object, there is provided a circuit for calculating an ELP and an EEP comprising: first storage means for storing a syndrome value, a coefficient value of the ELP, a discrepancy value and a shortened code size; second storage means for storing the coefficient values of the ELP, the reciprocal value of the discrepancy, the discrepancy value, the coefficient values of the ELP and the values obtained by differentiating the coefficient values of the ELP; first selecting means for selectively outputting the values stored in the first storage means in response to control signals; second selecting means for selectively outputting the values stored in the second storage means in response to the control signals; multiplying means for multiplying the values selected by the first and second selecting means; third selecting means for selectively outputting the results multiplied by the multiplying means in response to the control signals; and third storage means for storing the resultant values selectively output by the third selecting means.

The multiplying means includes: a first multiplier for sequentially multiplying the output signal of the first selecting means by the high and low bits of the output signal from the second selecting means; fourth storage means for storing the result of multiplying the high bits of the second selecting means by the output signal of the first selecting means calculated by the first multiplier; and adding means for adding the result values stored in the fourth storage means to the result value obtained by multiplying the low bits from the second selecting means by the output signal of the first selecting means calculated by the first multiplier.

To accomplish the above objects, there is provided a method for calculating an ELP and an EEP including the steps of: resetting in response to a first control signal; obtaining the ELP by repeatedly executing the steps of calculating a discrepancy in response to a second control signal, calculating the coefficient values of the ELP in response to a fourth control signal, and calculating correction terms in response to a third control signal, during a clock period of twice an errata correction capability; resetting in response to the first control signal; calculating the coefficient values of the EEP by repeatedly executing the step of calculating the coefficient values of the EEP in response to said second control signal during the clock period being twice the errata correction capability; multiplying the size of a shortened code by the differentiated coefficient values of the ELP in response to a fifth control signal; and multiplying the size of the shortened code by the coefficient values of the ELP in response to a sixth control signal.

To accomplish another object, there is provided a Reed-Solomon decoder according to the present invention including: a circuit for calculating an ELP and an EEP; and a circuit for calculating errata values and the roots of the ELP by inputting the coefficient values of the ELP and the EEP calculated by the circuit for calculating the ELP and the EEP, wherein said circuit for calculating the ELP and the EEP comprises: first storage means for storing a syndrome value, coefficient values of the ELP, a discrepancy value and the size of a shortened code; second storage means for storing the coefficient values of the ELP, the reciprocal value of the discrepancy the discrepancy value, the coefficient values of the ELP and the values obtained by differentiating the coefficient values of the ELP; first selecting means for selectively outputting the values stored in the first storage means in response to the control signals; second selecting means for selectively outputting the values stored in the second storage means in response to the control signals; multiplication means for multiplying the values selected by the first and second selecting means; third selecting means for selectively outputting the results multiplied by the multiplication means in response to the control signals; and third storage means for storing the multiplied result from the third selecting means.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The Reed-Solomon decoder of the present invention is explained hereinafter with reference to the attached drawings.

Figure 1:
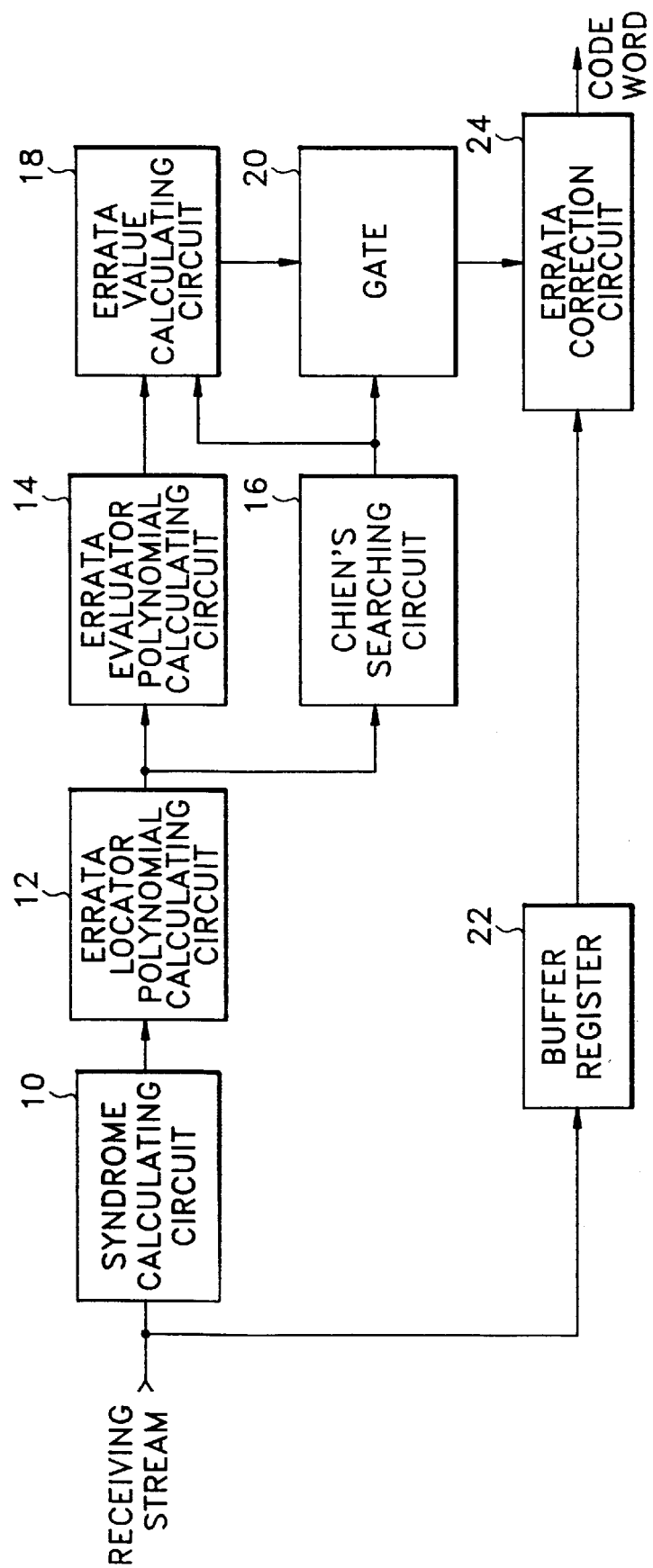
FIG. 1 is a block diagram of a conventional Reed-Solomon decoder.
Figure 2:
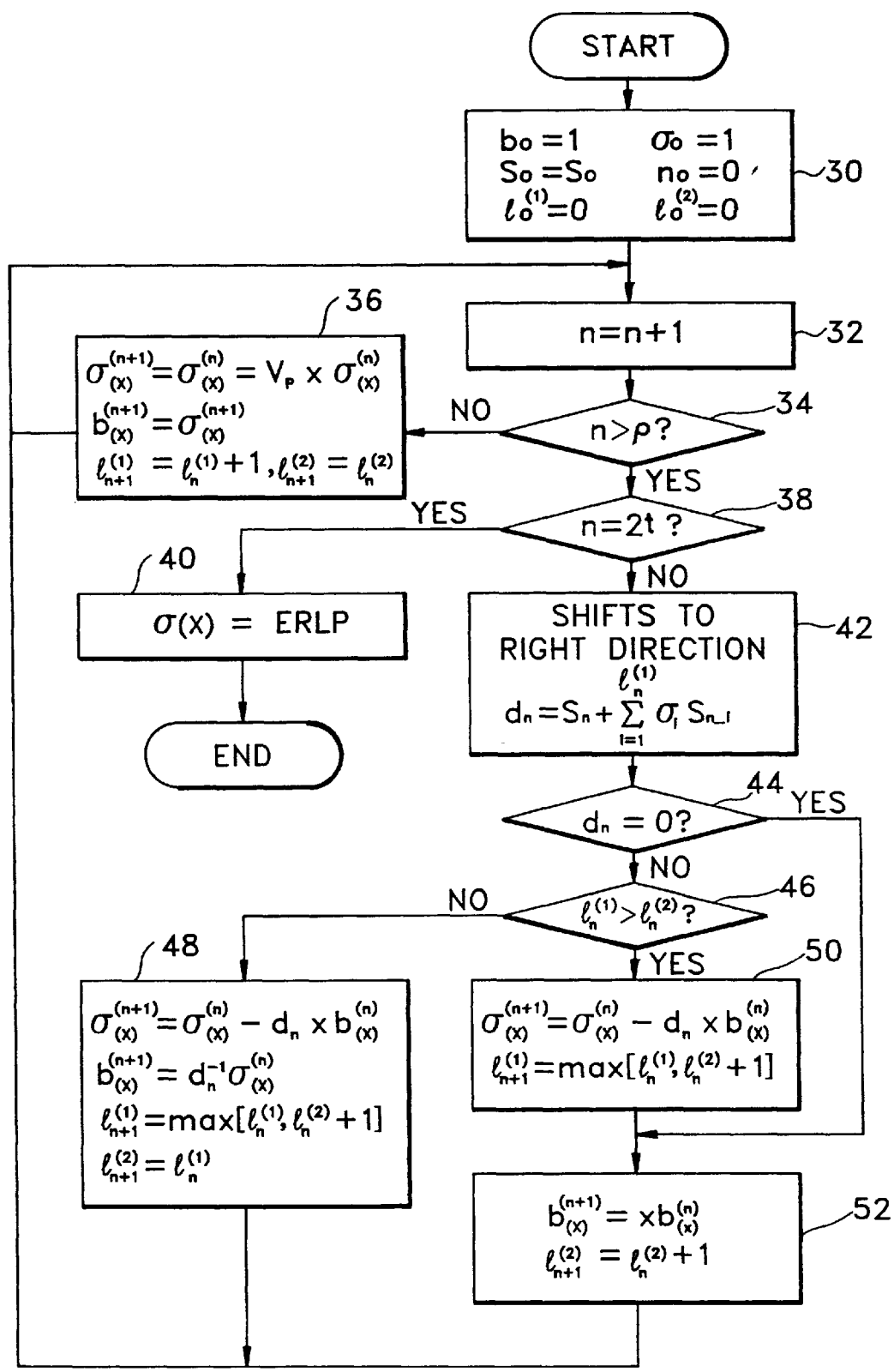
FIG. 2 is a flow chart of a conventional Berlekamp-Messay Algorithm (BMA)
Figure 3:
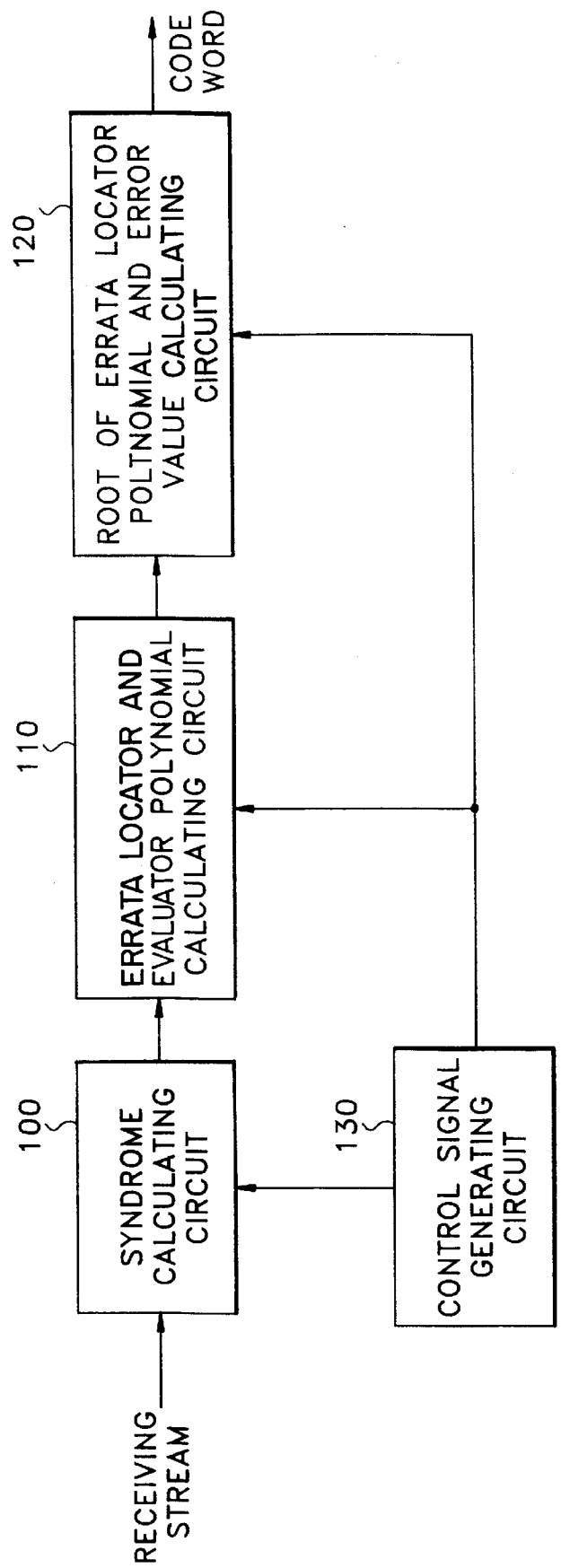
FIG. 3 is a block diagram of the Reed-Solomon decoder of the present invention.

As shown in FIG. 3, the Reed-Solomon decoder includes syndrome calculating circuit 100, ELP and EEP calculating circuit 110, circuit 120 for calculating the errata value and the root of the ELP and control signal generating circuit 130.

The Reed-Solomon decoder of the present invention incorporates the ELP and EEP calculating circuit into one block, thereby sharing a multiplier unlike conventional Reed-Solomon decoders.

Figure 4:
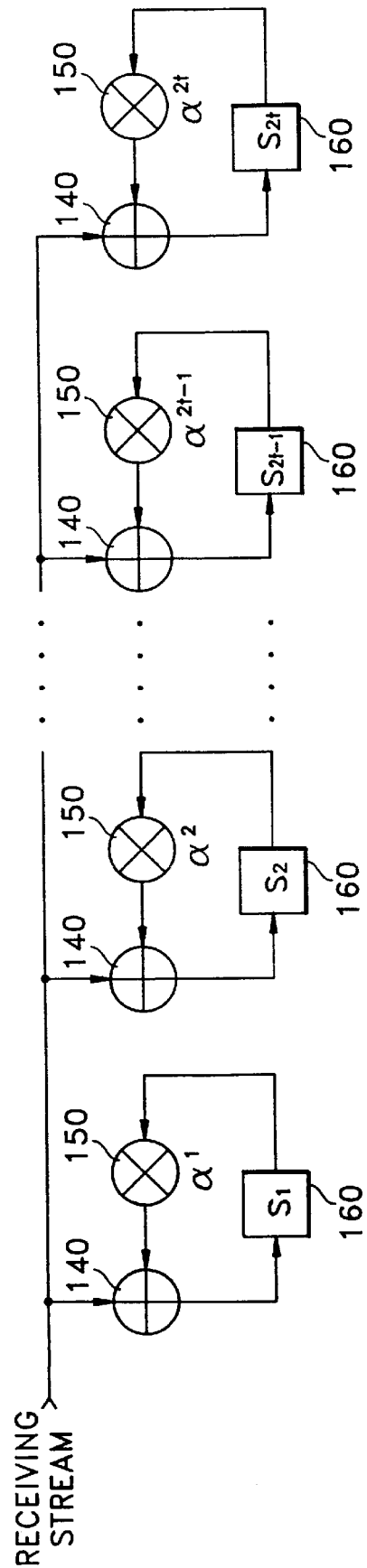
FIG. 4 is a block diagram of the circuit for calculating the syndrome of the Reed-Solomon decoder of the present invention.

As shown in FIG. 4., the syndrome calculating circuit 100 of FIG. 3 includes modulo-2 adders 140, multipliers 150 and syndrome value storages 160.

Syndrome can be obtained by substituting $\alpha^i (1 \leq i \leq 2t)$ which are elements of GF ($2^m$) in a receiving stream (r(x))

Figure 5:
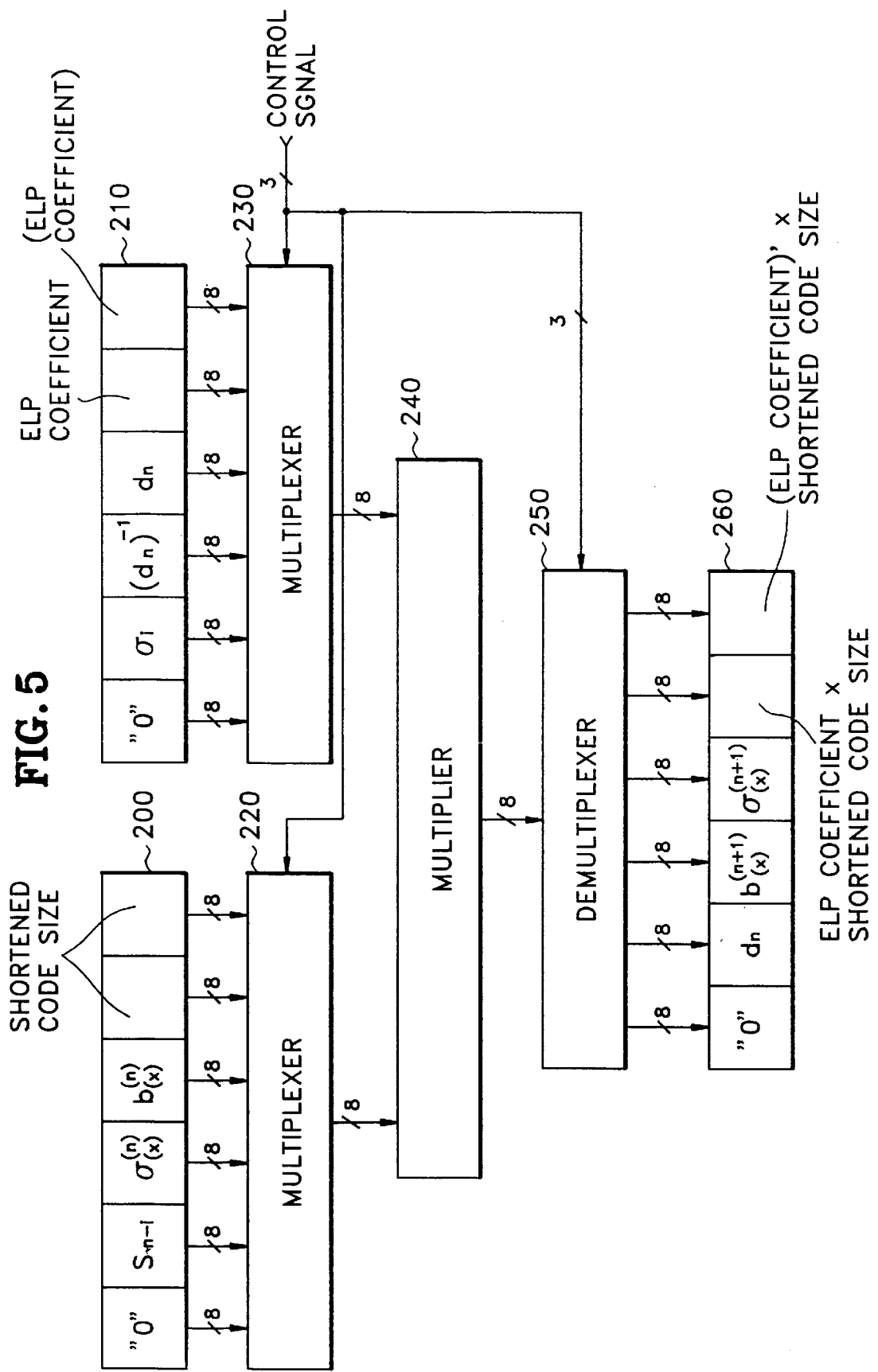
FIG. 5 is a block diagram of the circuit for calculating the ELP and EEP of the Reed-Solomon decoder of the present invention.

FIG. 5 is a detailed block diagram of the ELP and EEP calculating circuit 110 shown in FIG. 3.

As shown in FIG. 5, the ELP and EEP calculating circuit 110 includes registers 200, 210 and 260, multiplexers 220 and 230, demultiplexer 250 and multiplier 240.

The ELP and EEP calculating circuit 110 of the present invention constructed as described above, responds to first to sixth control signals (CS1, CS2, CS3, CS4, CS5 and CS6) to perform an operation. Therefore, control signal of 3 bits is needed to differentiate the six control signals.

Figure 6:
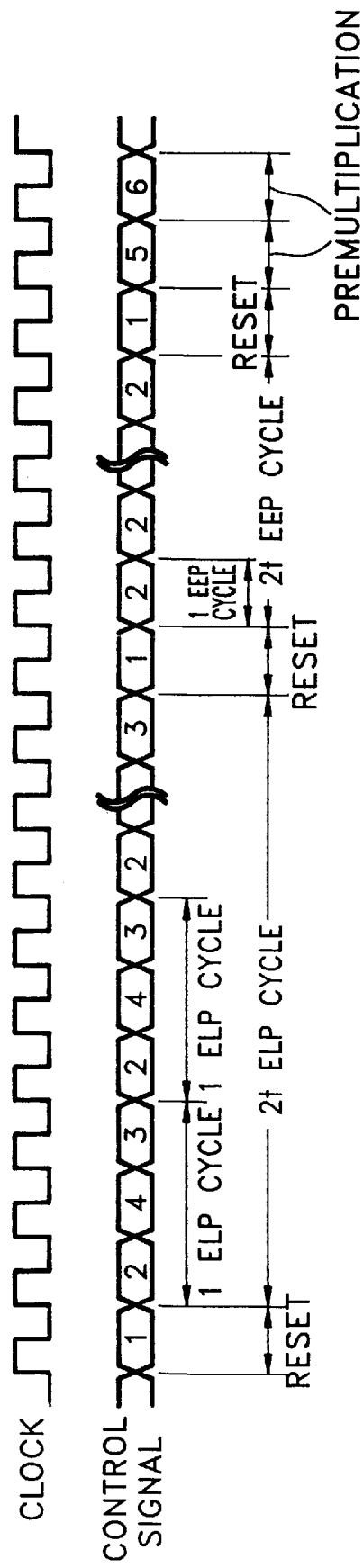
FIG. 6 is a diagram showing operation timing of the block diagram shown in FIG. 5.

The operation of the ELP and EEP calculating circuit shown in FIG. 5 can now be explained with reference to FIG. 6.

First of all, the control signals (CS1–CS6) are sequentially generated one per clock period. Multiplexers 220 and 230 transmit the value of "0" stored in registers 200 and 210 to multiplier 240 in response to the first control signal (CS1). Namely, multiplier 240 is reset. In order to calculate the coefficient values of the EEP and the discrepancy ($d_n$), multiplexers 220 and 230 transmit the coefficient values ($\sigma_i$) of the ELP and the syndrome value ($s_{n-i}$) from registers 200 and 210 to multiplier 240 in response to the second control signal (CS2). Multiplier 240 multiplies these values to transmit the multiplied values to demultiplexer 250. The values are stored in register 260. In order to calculate the coefficient values ($\sigma_{(x)}^{(n+1)}$ of the ELP, multiplexers 220 and 230 output the discrepancy ($d_n$) value and correction terms ($b_{(x)}^{(n)}$) stored in registers 200 and 210 to multiplier 240 in response to the fourth control signal (CS4). Multiplier 240 multiplies these values to transmit the multiplied values to demultiplexer 250. The values are stored in register 260. In order to calculate the correction terms ($b_{(x)}^{(n+1)}$), the discrepancy ($d_n^{-1}$) and the coefficient values ($\sigma_{(x)}^{(n)}$) of the ELP stored in registers 200 and 210 are transmitted to multiplier 240 via multiplexers 220 and 230 in response to the third control signal (CS3). Multiplier 240 multiplies these values to transmit the multiplied values to demultiplexer 250. Register 260 stores the resultant value output from demultiplexer 250. The operation according to control signals CS2, CS4 and CS3 is repeatedly carried out 2t times to obtain the final ELP. Therefore, 3 clock periods are needed to obtain the coefficients of one ELP and 3×2t clock periods are needed to obtain the coefficients of 2t ELP.

Next, to calculate the EEP, the circuit is reset in response to the first control signal (CS1). Then, to calculate the coefficient values of the EEP, the syndrome value ($s_{n-i}$) and the coefficient values ($\sigma_i$) of the ELP are transmitted from registers 200 and 210 to multiplier 240 via multiplexers 220 and 230 in response to the second control signal (CS2). Multiplier 240 receives these values and performs the multiplication to transmit the multiplied values to register 260 via demultiplexer 250. Namely, to obtain the coefficient values of one EEP, one clock period is needed and in order to obtain 2t EEP, 2t clock periods are needed.

After the ELP and the EEP are obtained as above, premultipication is executed as follows. That is, multiplexers 220 and 230 transmit the size of a shortened code and the coefficient values of the ELP from registers 200 and 210 to multiplier 240 in response to the fifth control signal (CS5). Multiplier 240 multiplies these values to store the resultant values in register 260 via demultiplexer 250. The values ($\sigma'$) obtained by differentiating the coefficient values of the ELP and the size of the shortened code are transmitted from registers 200 and 210 to multiplier 240 in response to the sixth control signal (CS6). Multiplier 240 multiplies these values to store the resultant values in register 260 via demultiplexer 250.

Figure 7:
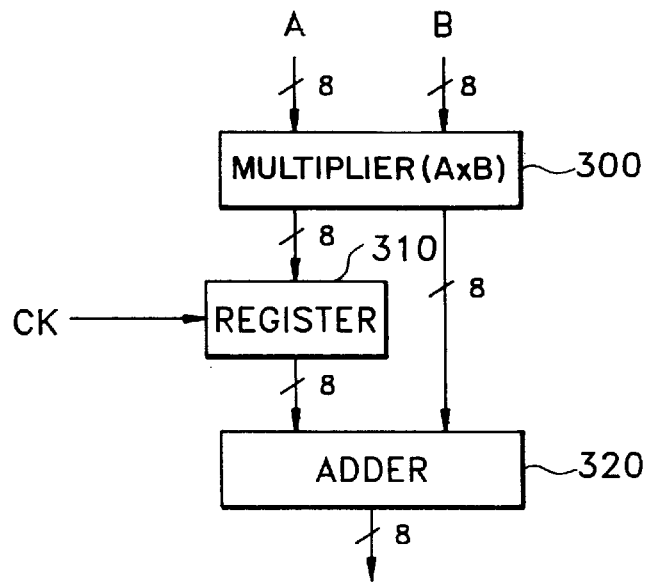
FIG. 7 is a block diagram of a multiplier shown in FIG. 5.

FIG. 7 is a detailed block diagram of the multiplier of the ELP and EEP calculating circuit 110 shown in FIG. 5 and the multiplier for performing the multiplication in response to the first control signal (CS1).

The multiplier shown in FIG. 7 includes a multiplier 300, a register 310 and an adder 320.

Multiplier 300 performs the multiplication of vector A and vector B. An example of such a multiplication follows.

The vector A of 8-tuple is multiplied by the vector B of 4-tuple and the vectors A and B can be expressed as follows, respectively.

$$A = a_0 + a_1 x + a_2 x^2 + a_3 x^3 + a_4 x^4 + a_5 x^5 + a_6 x^6 + a_7 x^7$$

$$B = b_0 + b_1 x + b_2 x^2 + b_3 x^3 + b_4 x^4 + b_5 x^5 + b_6 x^6 + b_7 x^7$$

The multiplication of the vector A by the vector B is performed as in the following equation.

If the output of multiplier 300 is Q, Q can be expressed as follow.

$$\begin{aligned} Q &= A \times B_4 \quad (10)\\ &= (a_0 b_0 + a_3 b_3 + a_6 b_2 + a_7 b_1) + (a_0 b_1 + a_1 b_0 + a_6 b_3 + a_7 b_2)x + \\ &\quad (a_0 b_2 + a_1 + b_1 + a_2 b_0 + a_5 b_3 + a_6 b_2 + a_7 b_1 + a_7 b_3)x^2 + \\ &\quad (a_0 b_3 + a_1 b_2 + a_2 b_1 + a_3 b_0 + a_5 b_3 + a_6 b_2 + a_6 b_3 + a_7 b_1 + \\ &\quad a_7 b_2)x^3 + \\ &\quad (a_1 b_3 + a_2 b_2 + a_3 b_1 + a_4 b_0 + a_5 b_3 + a_6 b_2 + a_6 b_3 + \\ &\quad a_7 b_1 + a_7 b_2 + a_7 b_3)x^4 + \\ &\quad (a_2 b_3 + a_3 b_2 + a_4 b_2 + a_5 b_0 + a_6 b_3 + a_7 b_2 + a_7 b_3)x^5 + \\ &\quad (a_3 b_3 + a_4 b_2 + a_5 b_1 + a_6 b_0 + a_7 b_3)x^6 + \\ &\quad (a_5 b_2 + a_6 b_1 + a_4 b_3 + a_7 b_0)x^7 \end{aligned}$$

$$\begin{aligned} Q &= A \times B_4 \quad (11)\\ &= (a_0 b_4 + a_5 b_7 + a_6 b_6 + a_7 b_5) + (a_0 b_5 + a_1 b_4 + a_6 b_7 + a_7 b_6)x + \\ &\quad (a_0 b_6 + a_1 b_5 + a_2 b_4 + a_5 b_7 + a_6 b_6 + a_7 b_5 + a_7 b_7)x^2 + \\ &\quad (a_0 b_7 + a_1 b_6 + a_2 b_5 + a_3 b_4 + a_5 b_7 + a_6 b_6 + a_6 b_7 + a_7 b_5 + \\ &\quad a_7 b_6)x^3 + \\ &\quad (a_1 b_7 + a_2 b_6 + a_3 b_5 + a_4 b_4 + a_5 b_7 + a_6 b_6 + a_6 b_7 + \\ &\quad a_7 b_5 + a_7 b_6 + a_7 b_7)x^4 + \\ &\quad (a_2 b_7 + a_3 b_6 + a_4 b_5 + a_5 b_4 + a_6 b_7 + a_7 b_6 + a_7 b_7)x^5 + \\ &\quad (a_3 b_7 + a_4 b_6 + a_5 b_5 + a_6 b_4 + a_7 b_7)x^6 + \\ &\quad (a_5 b_6 + a_6 b_5 + a_4 b_7 + a_7 b_4)x^7 \end{aligned}$$

The multiplication ($A \times B_4$) during the first clock period is performed according to equation (10) and the multiplication ($A \times B_4$) during the second clock period is performed according to equation (11). Register 310 stores the result calculated during the first clock period until the multiplication during the second clock period is finished. The frequency of the clock for driving register 310 is twice that of a system clock of the decoder. Therefore, time needed to perform the multiplication is one system clock period. Namely, register 310 stores the result calculated during the first clock period to maintain the result until the operation is performed during the second clock period.

If the result stored in register 310 is M and the result directly output from multiplier 300 is N, adder 320 performs addition as shown in the following equation. Namely, the adder for adding random 8-tuple vectors M to N on the Galois Field performs the operation as shown in the following equation.

$$\begin{aligned} H &= M + N x^4 \quad (12)\\ &= (m_0 + m_1 x + m_2 x^2 + m_3 x^3 + m_4 x^4 + m_5 x^5 + m_6 x^6 + m_7 x^7) + \\ &\quad (n_0 + n_1 x + n_2 x^2 + n_3 x^3 + n_4 x^4 + n_5 x^5 + n_6 x^6 + n_7 x^7)x^4 \\ &= (m_0 + n_4) + (m_1 + n_5)x + (m_2 + n_4 + n_6)x^2 + (m_3 + n_4 + n_5 + n_7)x^3 + \\ &\quad (m_4 + n_0 + n_4 + n_5 + n_6)x^4 + (m_5 + n_1 + n_5 + n_6 + n_7)x^5 + \\ &\quad (m_6 + n_2 + n_6 + n_7)x^6 + (m_7 + n_3 + n_7)x^7 \end{aligned}$$

When the multiplication is performed as above, a lot of gates can be reduced as shown in the following table, as compared with the conventional multiplier.

| | Classification | |
|---|---|---|
| Gate | Conventional multiplier | Multiplier of the present invention |
| AND gate | 64 | 32 |
| XOR gate | 83 | 48 |
| Register | 0 | 8 |

Figure 8:
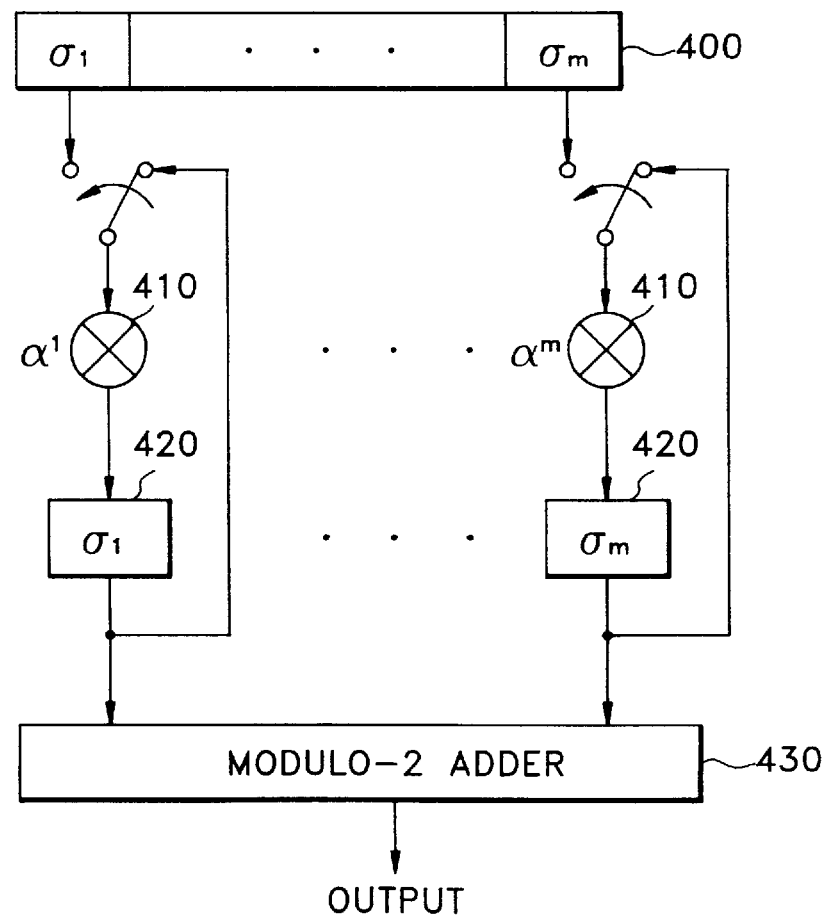
FIG. 8 is a block diagram of the circuit for calculating the roots of the ELP of the Reed-Solomon decoder of the present invention.

FIG. 8 is a block diagram of the circuit for calculating the roots of the ELP.

As shown in FIG. 8, the circuit for calculating the roots of the ELP includes register 400, multiplier 410, register 420 and modulo-2 adder 430.

Multiplier 410 multiplies the coefficient values ($\sigma_1, \ldots, \sigma_m$) of the ELP by $\alpha_1, \ldots, \alpha_m$ which are the elements of GF ($2^m$) to store the calculated values in register 420. The values are added by modulo-2 adder 430 to finally calculate the roots of the ELP and output the resultant values. Further, the output signal of multiplier 410 is stored in register 420 and then the stored signal is fed back to be multiplied again. The time needed to calculate the roots of the ELP is n symbol clocks.

Figure 9:
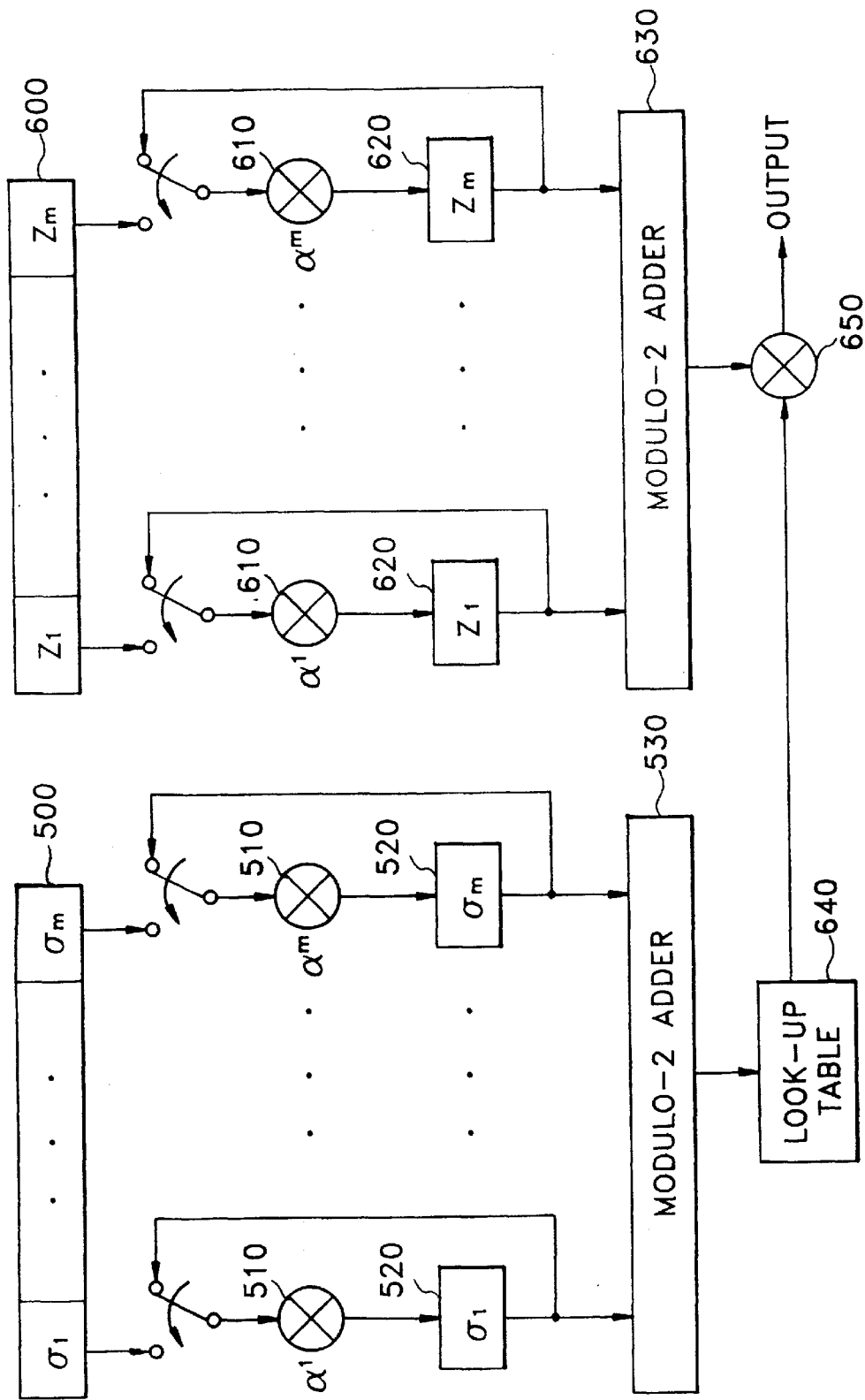
FIG. 9 is a block diagram of the circuit for calculating the errata values of the ELP of the Reed-Solomon decoder of the present invention.

FIG. 9 is a block diagram of the circuit of calculating the errata values for the ELP.

The circuit of calculating the errata values for the ELP, as shown in FIG. 9, includes register 500, multiplier 510, register 520, modulo-2 adder 530, register 600, multiplier 610, register 620, modulo-2 adder 630, look-up table 640 and multiplier 650.

As shown in FIG. 9, the constructions of register 500, multiplier 510, register 520 and modulo-2 adder 530 are identical to the constructions of those in the circuit of calculating the roots of the ELP and the resultant values output from modulo-2 adder 530 become the roots of the ELP and are input to look-up table 640 to output the reciprocal values of the roots of the ELP. Register 600 stores the coefficient values- of the ELP and multiplier 610 multiplies the values by $\alpha_1, \ldots, \alpha_m$ which are the elements of GF ($2^m$). The resultant values are stored in register 620 and then fed back to be multiplied by multiplier 610 or are input to modulo-2 adder 630 to be operated on. The output signal of modulo-2 adder 630 is multiplied by the output signal of look-up table 640 in multiplier 650 in order to obtain the errata values. This operation is performed to obtain the final errata values.

As described above, the Reed-Solomon decoder of the present invention shares the multiplier of the circuit for obtaining the ELP and the EEP. Thus it is possible to simplify the circuit construction to thereby reduce the chip area.

What is claimed is:

1. A circuit for calculating an ELP and an EEP comprising:

first storage means for storing a syndrome value, coefficient values of the ELP, a discrepancy value and a shortened code size;

second storage means for storing the coefficient values of the ELP, the reciprocal value of the discrepancy, the discrepancy value, the coefficient values of the ELP and the values obtained by differentiating the coefficient values of the ELP;

first selecting means for selectively outputting the values stored in said first storage means in response to control signals;

second selecting means for selectively outputting the values stored in said second storage means in response to the control signals;

multiplying means for multiplying the values selected by the first and second selecting means;

third selecting means for selectively outputting the resultant values multiplied by said multiplying means in response to the control signals; and third storage means for storing the resultant values selectively output by said third selecting means.

2. A circuit for calculating an ELP and an EEP according to claim 1, wherein said multiplying means comprises:

a first multiplier for sequentially multiplying the output signal of said first selecting means by high bits and low bits of the output signal of said second selecting means;

fourth storage means for storing the result of multiplying the high bits of said second selecting means by the output signal of said first selecting means calculated by the first multiplier; and adding means for adding the result values stored in said fourth storage means to the result obtained by multiplying the low bits of said second selecting means by the output signal of said first selecting means calculated by said first multiplier.

3. A method of calculating an ELP and an EEP comprising the steps of:

resetting in response to a first control signal;

obtaining the ELP by repeatedly executing the steps of calculating a discrepancy in response to a second control signal, calculating the coefficient values of the ELP in response to a fourth control signal, and calculating correction terms in response to a third control signal;

resetting in response to said first control signal;

calculating the coefficient values of the EEP by repeatedly executing the step of calculating the coefficient values of the EEP in response to said second control signal;

multiplying the size of a shortened code by the differentiated coefficient values of the ELP in response to a fifth control signal; and multiplying the size of the shortened code by the coefficient values of the ELP in response to a sixth control signal.

4. A Reed-Solomon decoder comprising:

a circuit for calculating an ELP and an EEP; and a circuit for calculating errata values and the roots of the ELP for calculating the errata values and the roots of the ELP by inputting the coefficient values of the ELP and the EEP calculated by the circuit for calculating the ELP and the EEP, wherein said circuit for calculating the ELP and the EEP comprises:

first storage means for storing a syndrome value, coefficient values of the ELP, a discrepancy value and the size of a shortened code;

second storage means for storing the coefficient values of the ELP, the inverse value of the discrepancy, the discrepancy value, the coefficient values of the ELP and the values obtained by differentiating the coefficient values of the ELP;

first selecting means for selectively outputting the values stored in said first storage means in response to control signals;

second selecting means for selectively outputting the values stored in said second storage means in response to the control signals;

multiplication means for multiplying the values selected by the first and second selecting means;

third selecting means for selectively outputting the resultant values multiplied by multiplication means in response to the control signals; and third storage means for storing the resultant values selectively output by the third selecting means.

5. A Reed-Solomon decoder according to claim 4, wherein said multiplying means comprises:

a first multiplier for sequentially multiplying the output signal of said first selecting means by high bits and low bits of the output signal of said second selecting means by low bits thereof;

fourth storage means for storing the resultant values of the multiplication of the high bits of said second selecting means by the output signal of said first selecting means calculated by the first multiplier; and adding means for adding the resultant values stored in said fourth storage means to the resultant values obtained by multiplying the low bits of said second selecting means by the output signal of said first selecting means calculated by said first multiplier.

* * * * *

UNITED STATES PATENT AND TRADEMARK OFFICE
CERTIFICATE OF CORRECTION

PATENT NO. : 5,805,616
DATED : September 8, 1998
INVENTOR(S) : Young-uk Oh

Page 1 of 1

It is certified that error appears in the above-identified patent and that said Letters Patent is hereby corrected as shown below:

Title page,
Change "[22]   Filed:   Mar. 20, 1996" to -- [22] Filed:  Nov. 3, 1995 --.

Signed and Sealed this

Fifteenth Day of January, 2002

Attest:

JAMES E. ROGAN
*Attesting Officer*       *Director of the United States Patent and Trademark Office*